United States Patent
Wu

(10) Patent No.: US 6,842,059 B1
(45) Date of Patent: Jan. 11, 2005

(54) MUXED-OUTPUT DOUBLE-DATE-RATE-2 (DDR2) REGISTER WITH FAST PROPAGATION DELAY

(75) Inventor: Ke Wu, San Jose, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 0 days.

(21) Appl. No.: 10/709,132

(22) Filed: Apr. 15, 2004

Related U.S. Application Data

(63) Continuation of application No. 10/249,581, filed on Apr. 21, 2003, now Pat. No. 6,741,111.

(51) Int. Cl.[7] .................................................. H03K 3/12
(52) U.S. Cl. ..................... 327/199; 327/200; 327/201
(58) Field of Search .............................. 327/199, 200, 327/201, 202, 203, 214

(56) References Cited

U.S. PATENT DOCUMENTS

| | | | |
|---|---|---|---|
| 5,391,935 A | 2/1995 | Gersbach et al. ............. | 327/198 |
| 5,410,194 A | 4/1995 | Freidin et al. ................. | 325/46 |
| 5,751,174 A | 5/1998 | Kuo et al. .................... | 327/199 |
| 5,994,935 A | 11/1999 | Ueda et al. ................... | 327/202 |
| 6,249,483 B1 | 6/2001 | Kim ............................. | 365/233 |
| 6,462,596 B1 | 10/2002 | Varma .......................... | 327/218 |
| 6,510,100 B2 | 1/2003 | Grundon et al. ............. | 365/233 |
| 6,542,416 B1 | 4/2003 | Hampel et al. .............. | 365/194 |
| 6,584,578 B1 | 6/2003 | Faue ............................ | 713/503 |
| 6,691,272 B2 | 2/2004 | Azim ........................... | 714/744 |
| 2002/0180516 A1 * | 12/2002 | Harrison ...................... | 327/563 |

* cited by examiner

*Primary Examiner*—Timothy P. Callahan
*Assistant Examiner*—An T. Luu
(74) *Attorney, Agent, or Firm*—Stuart T. Auvinen

(57) ABSTRACT

A register chip for double-data-rate (DDR) memory modules operates in 1:1 mode or 1:2 mode. A differential input clock is buffered to generate a slave clock that continuously clocks slave stages of flip-flops, and gated to generate a first clock pulsing only in 1:1 mode and a second clock pulsing only in 1:2 mode. The master stage has two input transmission gates, one activated by the first clock and another activated by the second clock. In 1:1 mode a first data bit is sampled by the first clock, but in 1:2 mode a second data bit is sampled by the second clock. The sampled bit is inverted and applied to the slave stage and to a feedback gate that has transistors gated by the first and second clocks. The clock-to-output delay is improved since an output mux is replaced by the muxing function built into the master stage.

20 Claims, 7 Drawing Sheets

US 6,842,059 B1

MUXED-OUTPUT DOUBLE-DATE-RATE-2 (DDR2) REGISTER WITH FAST PROPAGATION DELAY

CROSS REFERENCE TO RELATED APPLICATIONS

This application is a continuation-in-part of the co-pending application for "Data Register for Buffering Double-Data-Rate DRAMs with Reduced Data-Input-Path Power Consumption", U.S. Ser. No. 10/249,581, filed Apr. 21, 2003 now U.S. Pat. No. 6,741,111.

BACKGROUND OF INVENTION

This invention relates to integrated circuits, and more particularly to differential buffer chips.

Memory modules are widely used in electronic systems such as personal computers (PCs). Various standards are used, such as those by the Joint Electronic Device Engineering Council (JEDEC). Some JEDEC standards use double-data-rate (DDR) dynamic-random-access memory (DRAM) chips on modules known as dual-inline-memory-modules (DIMMs). A newer DDR-2 standard is also being implemented. Differential input signals are used for faster signaling.

Very high-speed buffer chips are needed for interfacing with the DDR-2 DRAM's. Each data line, and perhaps some address or control signals are buffered. Bi-directional data lines can be supported by using two uni-directional data-buffer slices in parallel but in reverse directions.

FIG. 1 shows a bit-slice for a data buffer chip that interfaces with DDR-2 DRAMs. Data inputs D1, D2 are some of 25 or so data lines input to a buffer chip. Data input D1 is compared to a reference voltage Vref by differential buffer 12, then applied to the D-input of flip-flop 20. Likewise, data input D2 is compared to reference voltage Vref by differential buffer 14, then applied to the D-input of flip-flop 22. Vref is a reference voltage such as Vcc/2.

The Q1 output of inverting buffer 16 is a latched data bit that can be applied to one of the DDR-2 DRAM's data inputs. The Q2 output of inverting buffer 18 is another latched data bit that can be applied to another one of the DDR-2 DRAM's data inputs.

When SEL is low, mux 24 selects the upper input, causing Q1 to be driven from the latched D1 from flip-flop 20. When SEL is high, mux 24 selects its lower input, causing Q1 to be driven from the latched D2 from flip-flop 22. SEL can be a mode signal that is low to indicate 1:2 mode, but high to indicate 1:1 mode. In 1:1 mode, tow different outputs are generated from two different inputs, but in 1:2 mode two outputs are generated from the same (D2) input.

Clock buffer 26 receives a differential clock CK and CKB, and generates a clock edge to flip-flops 20, 22 when the differential clock signals cross-over. Reset signal RST can be applied to differential buffers 12, 14, clock buffer 26, and flip-flops 20, 22.

While such a data buffer is useful, an added clock-to-output propagation delay occurs for the Q1 data, which passes through mux 24 compared with the Q2 data that does not have to be delayed by mux 24. Mux 25 may include transmission gates and inverter buffers needed to re-generate signals that are reduced in strength by the effective resistance of the transmission gates.

Since tight delay times are specified by the JEDEC standard, the data-path delay may have to be reduced, such as by using a higher-speed buffer 16 or larger drive-current transistors in mux 24. However, increasing the speed of buffer 16 requires a large current, which increases power consumption. Since there can be as many as 25 bit slices such as shown in FIG. 1 in a buffer chip, a large overall power consumption can occur. Such large power consumptions are undesirable.

What is desired is a buffer chip with lower power dissipation. A faster clock-to-output data output path from the flip-flop is desirable without relying on large-current differential input buffers.

DETAILED DESCRIPTION

The present invention relates to an improvement in buffer chips. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventor has realized that clock-to-output data path delays can be reduced if the output mux can be eliminated. Since the mux is in the critical path, removal of the mux can reduce propagation delays and allow for smaller buffers to be used for the data output path. The smaller buffers can result is a significant power reduction since one buffer is need for each of the 25 or so data input slices. The multiplexing function can be integrated with the flip-flops so that the inputs to the flip-flops are muxed rather than their outputs.

While the mux could simply be moved to before the flip-flop inputs, this could cause a different problem. The additional mux delay before the flip-flop could cause an increase in the data set-up time to the flip-flop. Thus simply moving the mux may not solve all problems. Rather than move the mux, the inventor merges the muxing function with the flip-flop itself.

Figure 2:
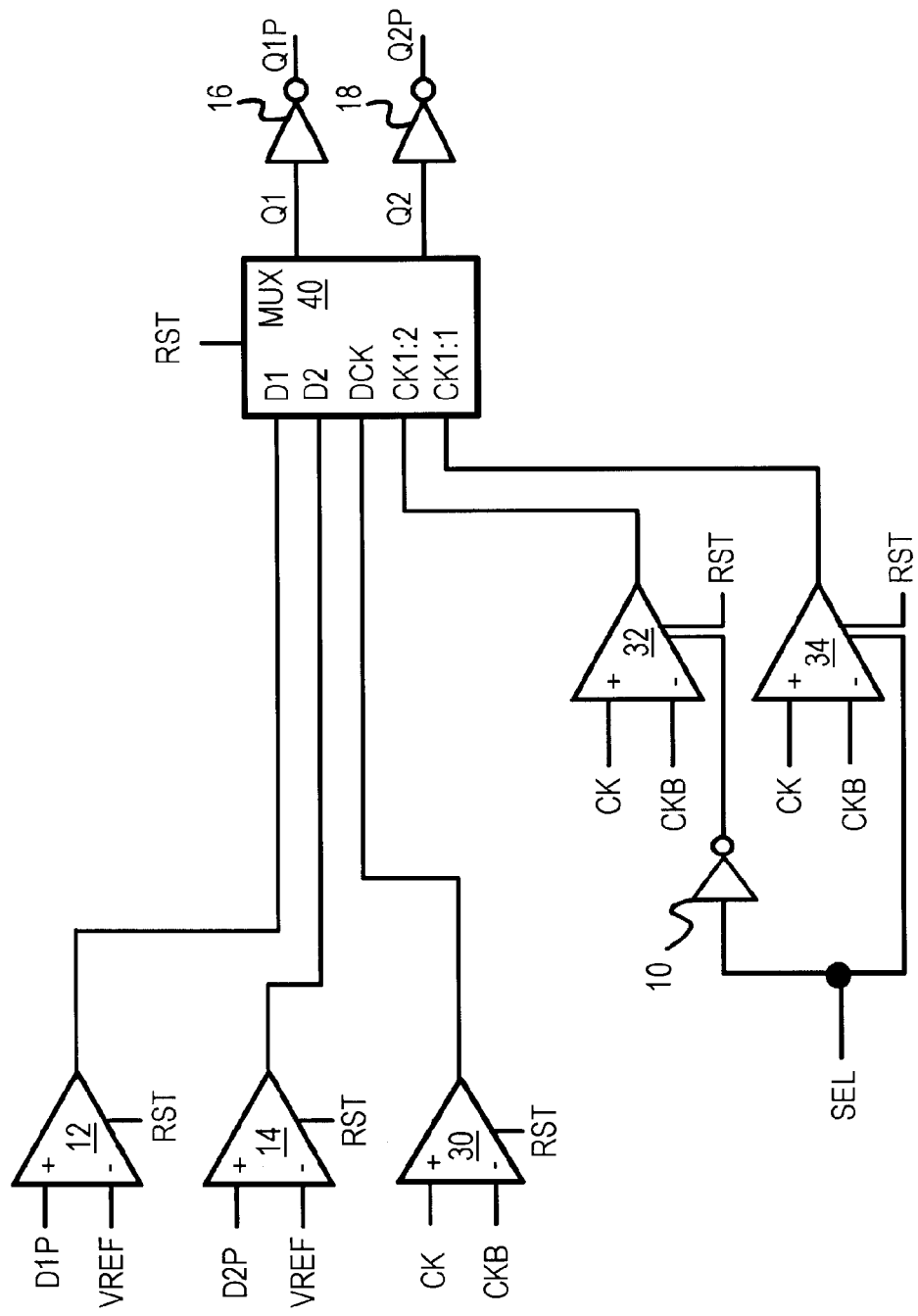
FIG. 2 shows a 2-bit slice of a buffer chip with a reduced clock-to-output delay by integration of the output data mux with the flip-flops.

FIG. 2 shows a 2-bit slice of a buffer chip with a reduced clock-to-output delay by integration of the output data mux with the flip-flops. Differential input buffers 12, 14 compare data inputs D1P, D2P to reference voltage Vref to generate single-ended data inputs D1, D2 when reset RST is not active.

The single-ended data inputs D1, D2 are input to muxing flip-flops 40. Muxing flip-flops 40 have an input mux to the master stage, allowing either one of the two data inputs D1, D2 to be latched into the master. The slave stage does not need muxing logic and can efficiently drive the output.

Figure 1:
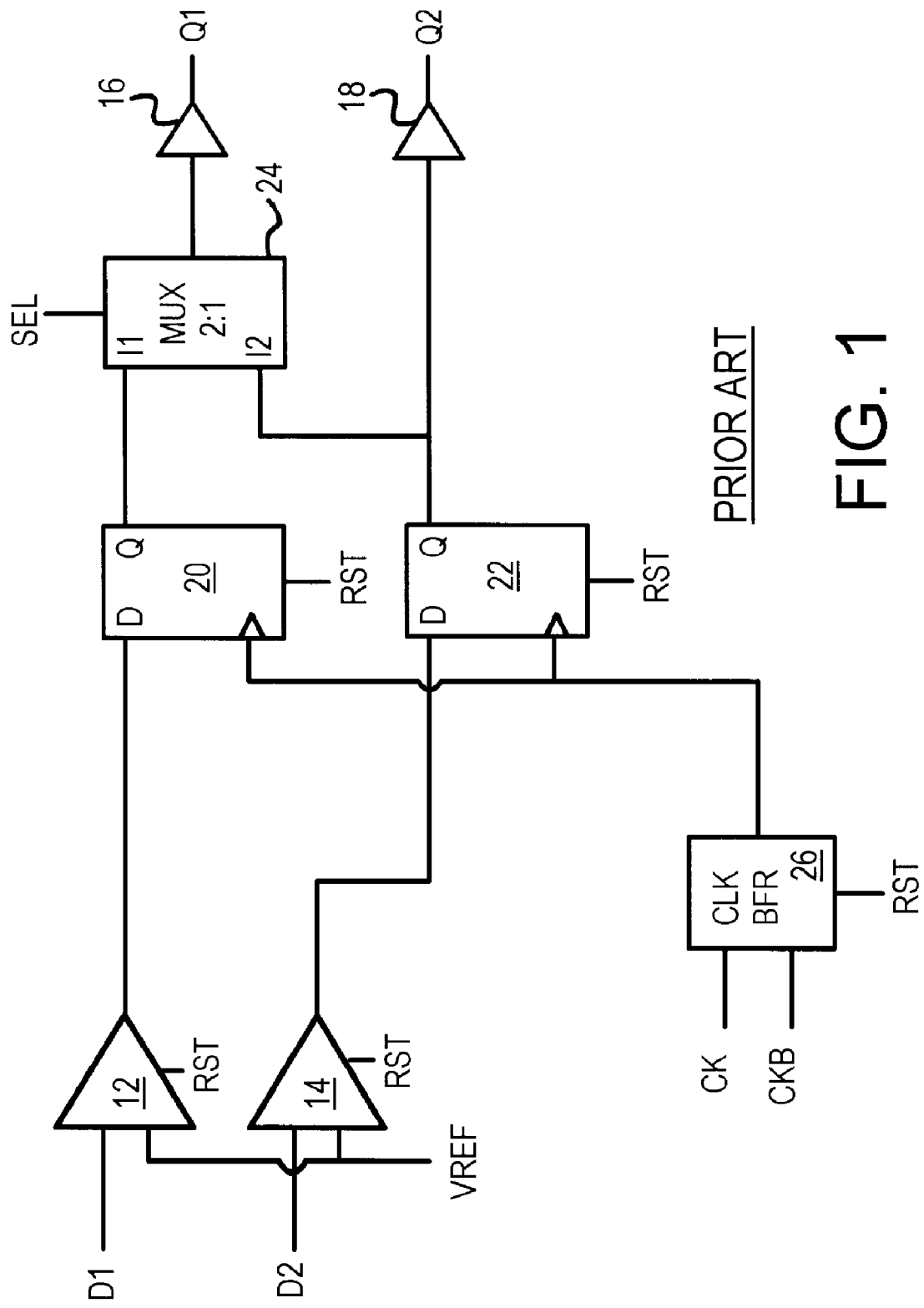
FIG. 1 shows a bit-slice for a data buffer chip that interfaces with DDR-2 DRAMs.

The Q1P output is generated by inverting buffer 16, which directly receives the Q1 output of muxing flip-flops 40, eliminating the output mux delay of FIG. 1. Likewise, the Q2P output is generated by buffer 18, which directly receives the Q2 output of muxing flip-flops 40.

To implement the desired DDR-2 output-muxing scheme, the Q1 output of muxing flip-flops 40 can be driven by a muxed-input flip-flop that receives both D1 and D2, while the Q2 output is driven by a standard flip-flop with a single input, D2. Alternately, the Q2 output can be driven by a muxed-input flip-flop that has D2 as both inputs to the mux. Signal delays can be better matched when both Q1 and Q2 data paths are similar.

Clocking of muxing flip-flops 40 is more complex than of a standard flip-flop. Three clocks are used. Clock buffer 30 generates a clock edge of DCK to muxing flip-flops 40 when differential clock signals CK, CKB cross-over. DCK is a free-running clock that clocks the slave stages in muxing flip-flops 40.

While slave-stage clock DCK is always running, only one of master clocks CK1:2 and CK1:1 is running at a time, depending on the mode. For 1:1 mode, master-stage clock CK1:1 pulses, while clock CK1:2 is static, non-pulsing. For 1:2 mode, master-stage clock CK1:2 pulses, while clock CK1:1 is static, non-pulsing.

Clock CK1:1 clocks in data from one of the two inputs to the muxed-input flip-flop, while clock CK1:2 clocks in data from the other of the two inputs to the muxed-input flip-flop in muxing flip-flops 40. Thus the mode, 1:1 or 1:2, determines which of clocks CK1:1 or CK1:2 is pulsing, and which of the two muxed data inputs is active and which is disabled. Thus the muxing function is controlled by clocks CK1:1, CK1:2.

Clock buffers 32, 34 receive the reset signal RST and a mode select signal SEL, or the inverse of SEL. When SEL is high, mode 1:2 is selected. The high SEL disables clock buffer 34, disabling clock CK1:1, while inverter 10 drives a low to the reset input of clock buffer 32, allowing clock CK1:2 to pulse.

When SEL is low, mode 1:1 is selected. The low SEL enables clock buffer 34, allowing clock CK1:1 to pulse, while inverter 10 drives a high to the reset input of clock buffer 32, disabling clock CK1:2. When reset RST is active, all clock buffers 30, 32, 34 are disabled from pulsing. Clock buffers 30, 32, 34 each generate a clock edge to muxing flip-flops 40 when differential clock signals CK, CKB cross-over and when its reset input is inactive (low).

Figure 3:
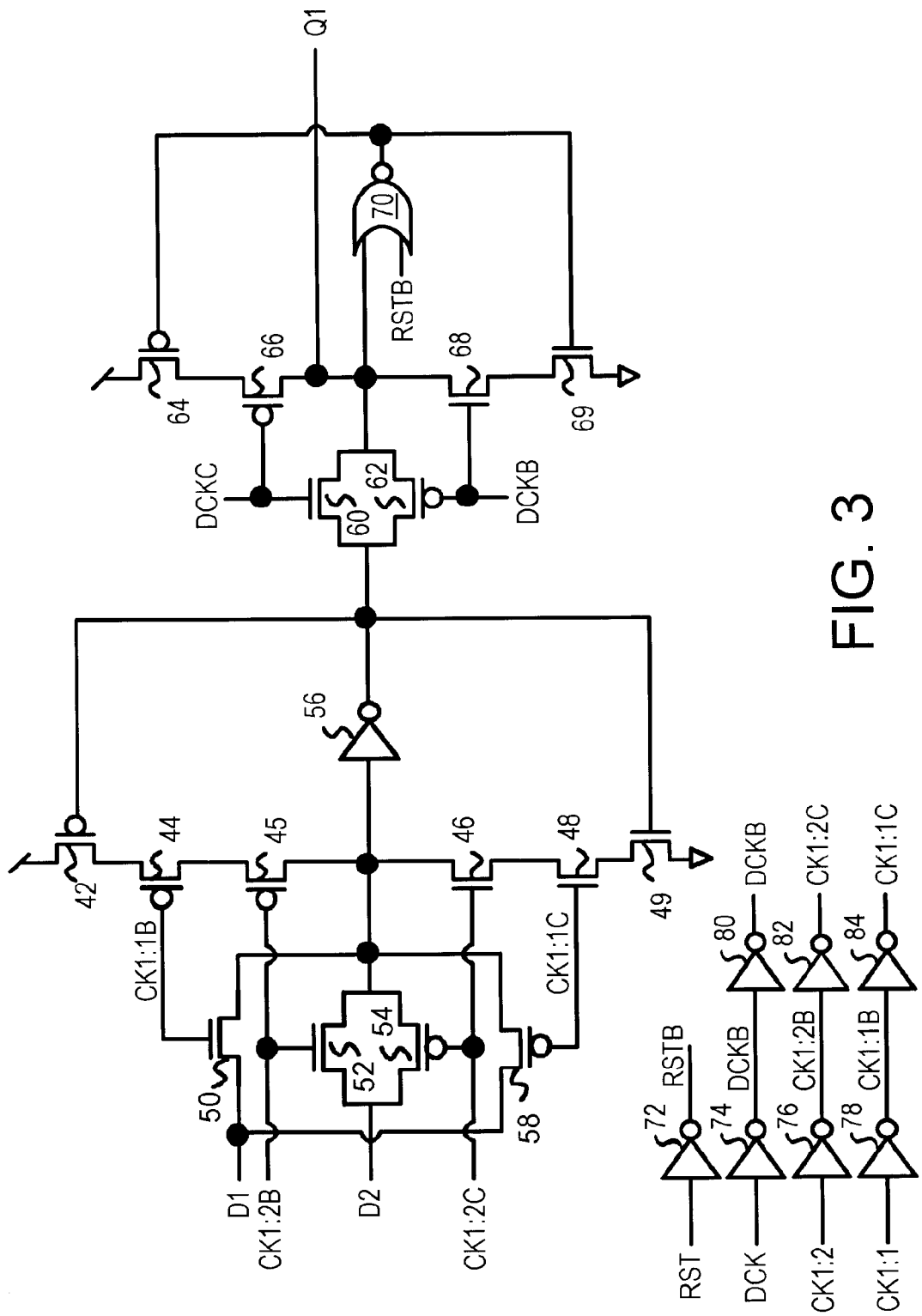
FIG. 3 is a schematic of a muxing flip-flop with different inputs.

FIG. 3 is a schematic of a muxing flip-flop with different inputs. Muxing flip-flops 40 of FIG. 3 can include the muxed-input flip-flop that latches in either D1 or D2 and drives the Q1 output, and the muxed-input flip-flop that latches in only D2 and drives the Q2 output, shown in FIG. 4.

Figure 5:
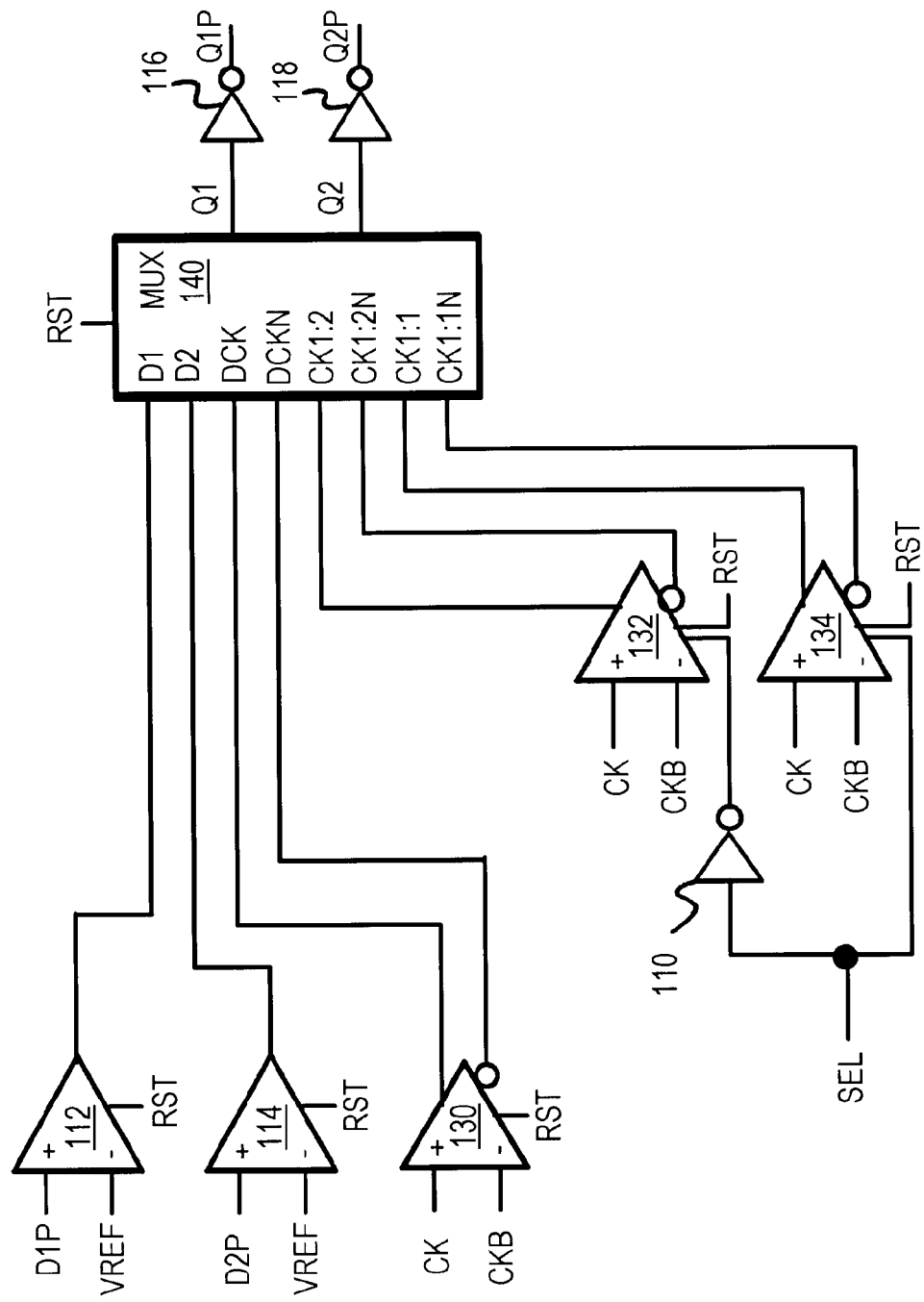
FIG. 5 is an alternate embodiment with differential clocks.

All clocks are generated from input clock CK, as shown in FIG. 5. When the input clock CK is high, the master stage feeds back while the slave stage latches the master data. When the input clock CK is low, the slave stage feeds back while the master stage samples either input data D1 or D2.

Slave clock DCK is inverter first by inverter 74 to generate DCKB, then inverted again by inverter 80 to generate DCKC. The slave clock pulses in both 1:1 and 1:2 modes. First master clock CK1:1 pulses high and low in 1:1 mode but is held high (inactive) in 1:2 mode. Inverter 78 inverts CK1:1 to generate CK1:1B, and inverter 84 re-inverts CK1:1B to generate CK1:1C. Second master clock. CK1:2 pulses high and low in 1:2 mode but is held high (inactive) in 1:1 mode. Inverter 76 inverts CK1:2 to generate CK1:2B, and inverter 82 re-inverts CK1:2B to generate CK1:2C. Inverter 72 inverts reset signal RST to generate RSTB.

The slave stage has a first transmission gate of transistors 60, 62 which are opened when DCK is high and DCKB is low. The feedback path is interrupted by transistors 66, 68 which conduct in the opposite clock state, when DCK is low. The output of transmission gate transistors 60, 62 is input to NOR gate 70, which drives feedback to p-channel transistor 64, which is in series with p-channel transistor 66, and n-channel transistor 69, which is in series with n-channel transistor 68. The Q1 output is taken from the output of transmission gate transistors 60, 62, which is also the drains of feedback transistors 66, 68.

The master stage has two input transmission gates, and two pairs of feedback transistors to perform the muxing function. One transmission gate is opened and closed by a clock, while the other transmission gate remains closed while its feedback transistors remain on.

The first transmission gate includes transmission gate transistors 50, 58 and inputs D1 to the master stage when clock CK1:1 pulses low. The second transmission gate includes transmission gate transistors 52, 54 and inputs D2 to the master stage when clock CK1:2 pulses low. Either clock CK1:1 pulses and clock CK1:2 remains high, when 1:1 mode is selected, or clock CK1:2 pulses and clock CK1:1 remains high, when 1:2 mode is selected. Thus the master stage samples only one input, D1 or D2, depending on the mode selected.

The master-stage output is taken from inverter 56 and drives the transmission gate into the slave stage. Feedback data within the master stage from inverter 56 is applied to the gates of p-channel transistor 42 and n-channel transistor 49.

A feedback gate includes p-channel transistors 42, 44, 45 and n-channel transistors 46, 48, 49 in series. The feedback gate drives the input of inverter 56. When the input clock CK is high, both CK1:1C and CK1:2C are high, causing n-channel transistors 46, 48 to conduct. Likewise, when input clock CK is high, both CK1:1B and CK1:2B are low, causing p-channel transistors 44, 45 conduct. When the output of inverter 56 is high, n-channel feedback transistor 49 is on and p-channel feedback transistor 42 is off, driving the input of inverter 56 low. When the output of inverter 56 is low, n-channel feedback transistor 49 is off and p-channel feedback transistor 42 is on, driving the input of inverter 56 high. The data applied to feedback transistors 42, 49 is thus inverted during recycling.

The feedback gate stops conducting when input clock CK is low, since either CK1:1C or CK1:2C is low, turning off n-channel transistor 48 or 46, respectively, and either CK1:1B or CK1:2B is high, turning off p-channel transistor 44 or 45, respectively.

In 1:1 mode, data input D1 passes through first transmission gate transistors 50, 58 when CK1:1B pulses high, and is inverted by inverter 56 and later latched into the slave stage when DCK goes low. Output Q1 is thus driven from input D1. This is the 1:1 mode. CK1:2B remains low in 1:1 mode, so second transmission gate transistors 52, 54 remain off as the primary clock CK pulses. Second feedback transistors 45, 46 remain on. Data is fed back from inverter 56 to p-channel transistor 42 and n-channel transistor 49, and is recycled to the input of inverter 56 when CK1:1B pulses low, and first feedback transistors 44, 48 turn on.

In 1:2 mode, data input D2 passes through second transmission gate transistors 52, 54 when CK1:2B pulses high, and is inverted by inverter 56 and later latched into the slave stage when DCK goes low. Output Q1 is driven from input D2. This is the 1:2 mode. CK1:1B remains low in 1:2 mode, so first transmission gate transistors 50, 58 remain off as the primary clock CK pulses. First feedback transistors 44, 48 remain on. Data is fed back from inverter 56 to p-channel transistor 42 and n-channel transistor 49, and is recycled to the input of inverter 56 when CK1:2B pulses low, and second feedback transistors 45, 46 turn on.

Figure 4:
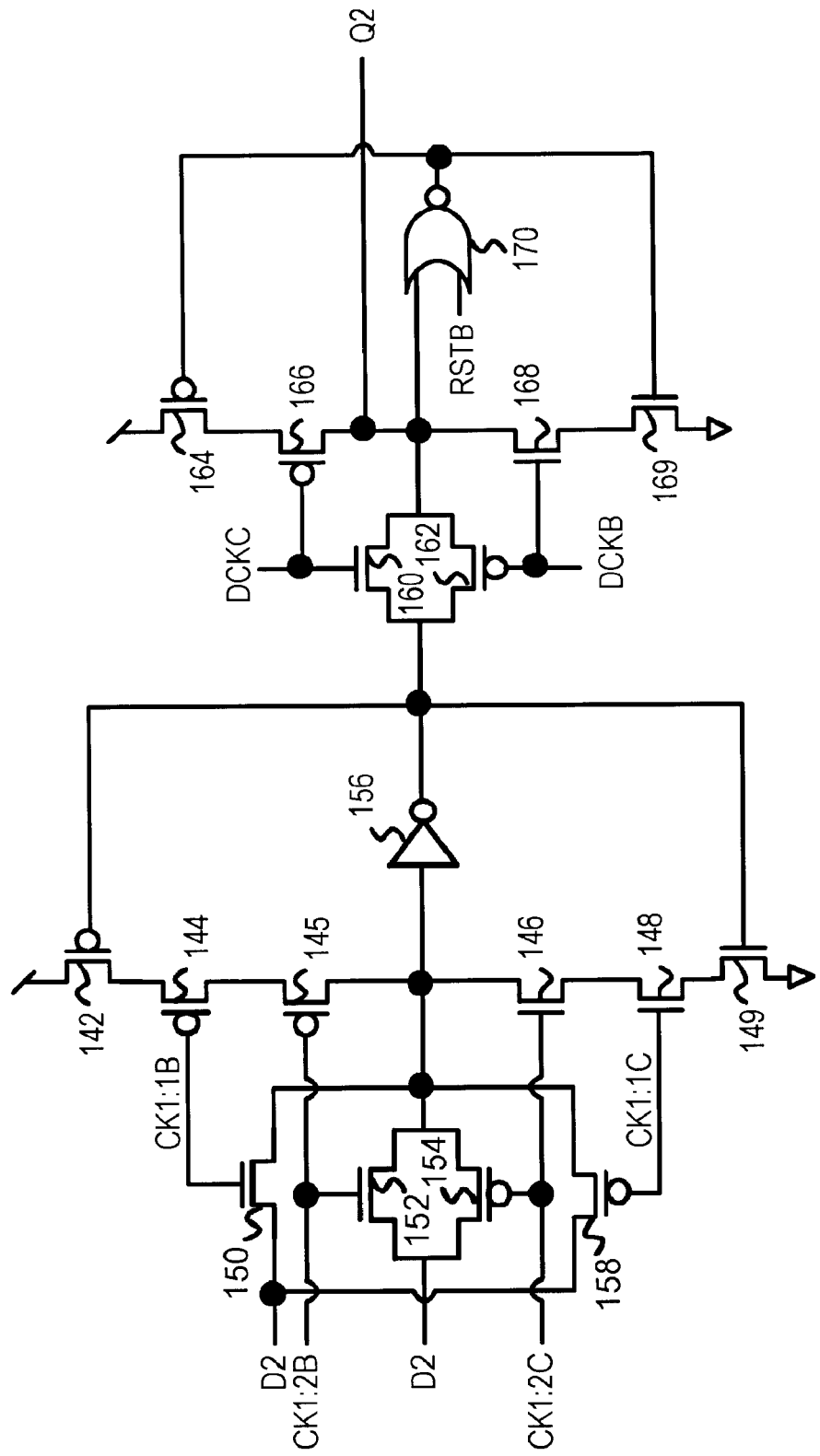
FIG. 4 is a schematic of a muxing flip-flop with identical inputs.

FIG. 4 is a schematic of a muxing flip-flop with identical inputs. Both the first transmission gate (transistors 150, 158) and the second transmission gate (transistors 152, 154) are connected to data input D2. Thus regardless of whether 1:1 or 1:2 mode is selected, data input D2 is latched to generate output Q2 from the drains of transistors 166, 168 in the slave stage.

Otherwise, the structure and operation is similar to that described for FIG. 3. Delay to output Q2 are similar to delays for output Q1 since the structure of the flip-flop of FIG. 4 is so similar to the structure of the flip-flop of FIG. 3. Such delay matching may be beneficial in some applications. Alternately, a standard flip-flop could be used for latching D2 to generate Q2, replacing the circuit of FIG. 4.

When reset RST is high, NOR gate 170 drives its output low. This causes Q2 to go high, which is inverted by inverter 18 (FIG. 2) to drive the final Q2 output low during reset.

FIG. 5 is an alternate embodiment with differential clocks. Differential may be originally input to the register chip. Differential signaling can continue into the chip to the transmission gates of the muxing flip-flops. FIG. 5 is similar to FIG. 3, except that differential clocks are output from clock buffers 130, 132, 134 and input to muxing flip-flops 140 as differential clocks.

For example, clock buffer 130 receives input clock CK, CKB and generates DCK, DCKN that are input to muxing flip-flops 140. Clock buffer 132 also receives differential input clock CK, CKB and generates CK1:2, CK1:2N, while clock buffer 134 receives input clock CK, CKB and generates CK1:1, CK1:1N.

Muxing flip-flops 140 receive a pair of complementary signals for each clock. While slave clocks DCK, DCKN continuously pulse in both 1:1 and 1:2 modes, master clocks CK1:1, CK1:1N pulse only in 1:1 mode, while CK1:1 stays high and CK1:1N stays low in 1:2 mode. Similarly, master clocks CK1:2, CK1:2N pulse only in 1:2 mode, while CK1:2 stays high and CK1:2N stays low in 1:1 mode.

Figure 6:
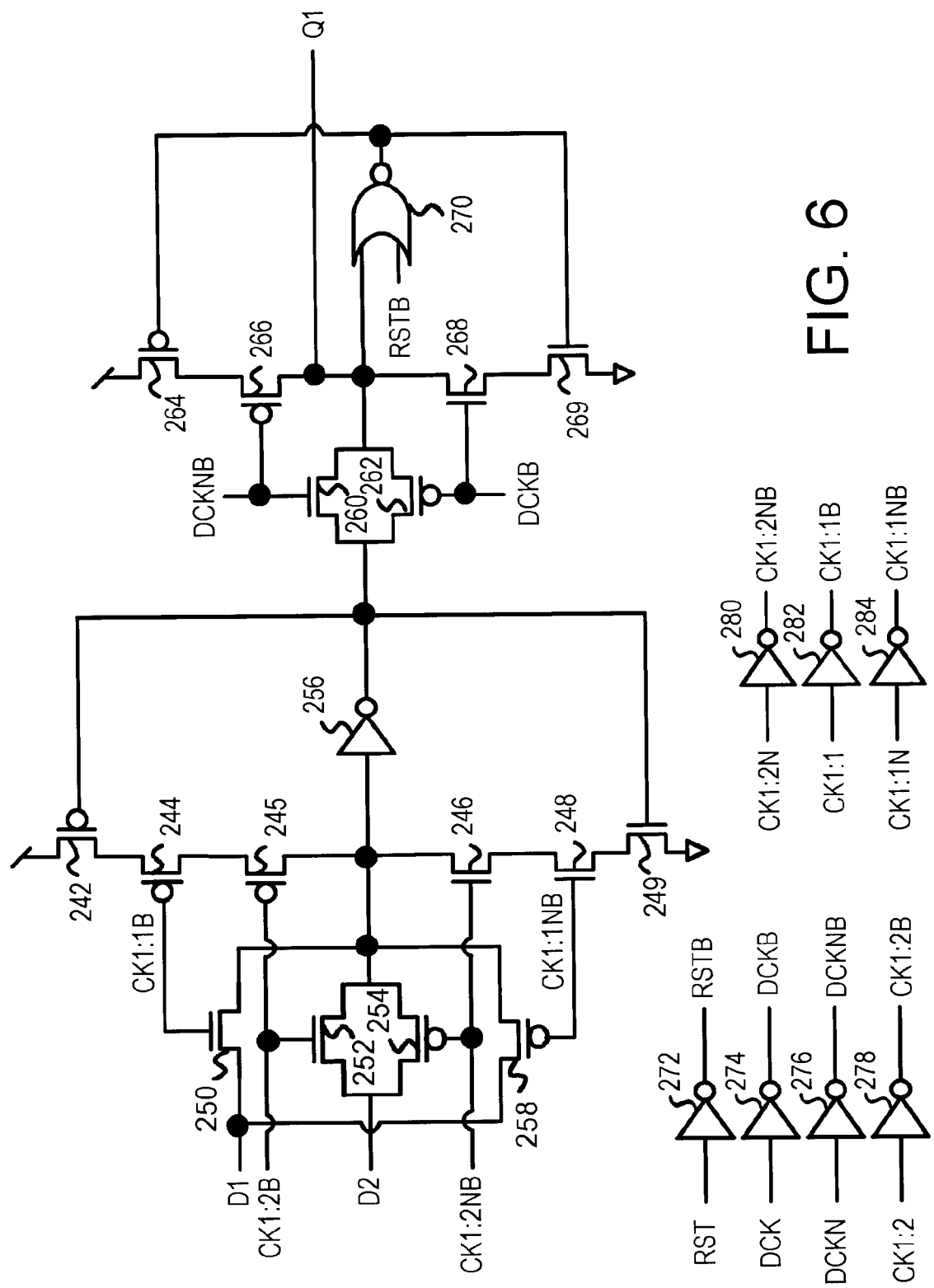
FIG. 6 shows a muxing flip-flop that has differential clocks as inputs.

FIG. 6 shows a muxing flip-flop that has differential clocks as inputs. Inverter 274 generates DCKB from positive differential clock DCK, while inverter 276 generates DCKNB from negative differential clock DCKN. DCKNB is applied to the gates of n-channel transmission gate transistor 260 and p-channel feedback transistor 266 in the slave stage, while DCKB is applied to the gates of p-channel transmission gate transistor 262 and n-channel feedback transistor 268 in the slave stage. The slave's input transmission gate is thus turned on when DCK and DCKNB are high, and DCKB is low.

Inverter 282 generates CK1:1B from positive differential clock CK1:1, while inverter 284 generates CK1:1NB from negative differential clock CK1:1N. CK1:1B is applied to the gates of n-channel transmission gate transistor 250 and p-channel feedback transistor 244 in the master stage to sample D1, while CK1:1NB is applied to the gates of p-channel transmission gate transistor 258 and n-channel feedback transistor 248 in the master stage. The master's D1 input transmission gate is thus turned on when CK1:1 and CK1:1NB are low, and CK1:1B is high.

Inverter 278 generates CK1:2B from positive differential clock CK1:2, while inverter 280 generates CK1:2NB from negative differential clock CK1:2N. CK1:2B is applied to the gates of n-channel transmission gate transistor 252 and p-channel feedback transistor 245 in the master stage to sample D2, while CK1:2NB is applied to the gates of p-channel transmission gate transistor 254 and n-channel feedback transistor 246 in the master stage. The master's D2 input transmission gate is thus turned on when CK1:2 and CK1:2NB are low, and CK1:2B is high.

Figure 7:
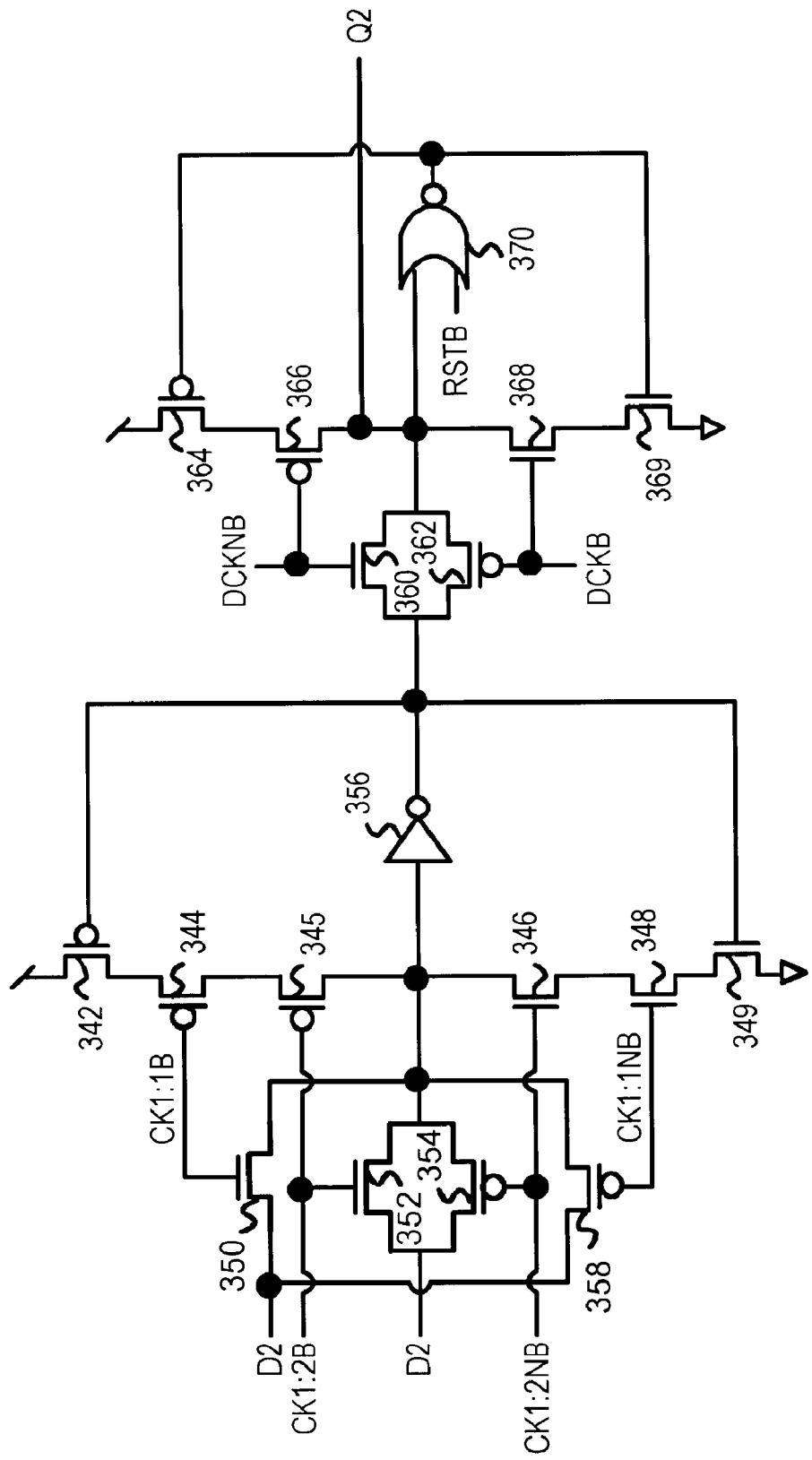
FIG. 7 is a schematic of a muxing flip-flop that has differential clocks as inputs and the same data input.

Operation is otherwise similar to that described earlier for the circuit of FIG. 4. FIG. 7 is a schematic of a muxing flip-flop that has differential clocks as inputs and the same data input. Data input D2 is applied to both the first transmission gate of transistors 350, 358, and to the second transmission gate of transistors 352, 354. Thus in both 1:1 and 1:2 modes, data D2 is sampled to generate Q2 from the slave stage.

Having differential clocks propagated though the muxing flip-flops can improve performance. For the worst-case clocks, one less inverter delay is needed when differential internal clocks are used, as in FIGS. 5–7, compared with the single-ended clocks of FIGS. 2–4. DCKC requires the clock buffer 30 plus two inverters 74, 80 (FIGS. 2, 3), while DCKNB requires clock buffer 130 plus only one inverter 276 (FIGS. 5, 6). Thus one inverter delay is saved using full differential clocking.

Alternate Embodiments

Several other embodiments are contemplated by the inventor. For example, different buffering, gating, and logic may be substituted. Inverters, NAND or NOR gates could be added to the clock or data buffers, or these gates can be replaced with other logic such as transmission gates and buffers or switch networks. Signals can be active high or active low.

Clocks could be free-running and yet still be disabled for power-saving or other disabling modes. Clocks could be free-running for shorter periods of time, such as when data is being transferred to or from the DRAM chips, while the clocks are disabled for other periods of time when the DRAM is not being accessed. The reset signals could be activated for these non-access time periods, or other disabling or power-down signals could be used. Global or local or some combination of buffering and inverting can be used.

The master and slave stages could be set or reset by adding various logic gates. For example, the slave can be set to 1 by a NOR gate 70 and an inverter, using an active-high reset to the NOR gate, or reset to 0 using a NAND gate with an active-low reset that replaces the NAND gate. The master stage could be set or reset in a similar manner by changing inverter 56 to a NAND or NOR gate. Keeper or leaker transistors could be added, as could capacitors and resistors or other passive components. Inverters and buffers could be added to the output, and multiple outputs or differential outputs could be generated. The muxing flip-flops 40 invert the data input, but a non-inverting flip-flop could be constructed by taking the output Q1 from the output of NOR gate 70 rather than from the input of NOR gate 70.

Any advantages and benefits described may not apply to all embodiments of the invention. When the word "means"

is recited in a claim element, Applicant intends for the claim element to fall under 35 USC Sect. 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A registered buffer chip comprising:

a mode signal that indicates a muxed mode and a non-muxed mode;

a differential clock input for receiving a differential clock signal;

a slave clock buffer, receiving the differential clock signal, for generating a continuous slave clock that pulses during both the muxed mode and during the non-muxed mode;

a first master clock buffer, receiving the differential clock signal, for generating a first clock that pulses during the non-muxed mode but does not pulse during the muxed mode;

a second master clock buffer, receiving the differential clock signal, for generating a second clock that pulses during the muxed mode but does not pulse during the non-muxed mode;

a dual-bit slice that comprises:

a first data input;

a first data buffer, receiving the first data input, for driving a first internal data signal;

a second data input;

a second data buffer, receiving the second data input, for driving a second internal data signal;

a first muxed flip-flop receiving the first internal data signal as a first mux input and the second internal data signal as a second mux input, for generating a first data output;

a second muxed flip-flop receiving the second internal data signal as both the first mux input and as the second mux input, for generating a second data output;

wherein the first muxed flip-flop and the second muxed flip-flop each comprise a muxed master stage and a slave stage;

wherein the muxed master stage comprises:

a first transmission gate that conducts between the first mux input and a master node in response to the first clock;

a second transmission gate that conducts between the second mux input and the master node in response to the second clock;

a master inverting gate, having the master node as an input, for driving a coupled node;

a master feedback gate, receiving the first clock and the second clock, and having the coupled node as an input, for driving the master node when neither the first transmission gate nor the second transmission gate are conducting;

wherein the slave stage comprises:

a slave transmission gate that conducts between the coupled node and a slave node in response to the slave clock;

a slave inverting gate, having the slave node as an input, for driving an output node; and a slave feedback gate, receiving the slave clock, and having the output node as an input, for driving the slave node when the slave transmission gate is not conducting, whereby the muxed master stage has muxed inputs clocked by mode-enabled clocks so that the first data output but not the second data output is muxed during the muxed mode.

2. The registered buffer chip of claim 1 wherein the master feedback gate comprises:

a first feedback p-channel transistor having a gate receiving the coupled node;

a second feedback p-channel transistor having a gate receiving an inverse of the second clock;

a third feedback p-channel transistor having a gate receiving an inverse of the first clock;

a first feedback n-channel transistor having a gate receiving the coupled node;

a second feedback n-channel transistor having a gate receiving the second clock;

a third feedback n-channel transistor having a gate receiving the first clock;

wherein the first, second, and third feedback p-channel transistors are in series between a power supply and the master node;

wherein the first, second, and third feedback n-channel transistors are in series between a ground and the master node.

3. The registered buffer chip of claim 2 wherein the first transmission gate comprises an n-channel transistor having a gate receiving the inverse of the first clock and a p-channel transistor receiving the first clock;

wherein the second transmission gate comprises an n-channel transistor having a gate receiving the inverse of the second clock and a p-channel transistor receiving the second clock.

4. The registered buffer chip of claim 3 wherein the slave feedback gate comprises:

a first slave feedback p-channel transistor having a gate receiving the output node;

a second slave feedback p-channel transistor having a gate receiving the slave clock;

a first slave feedback n-channel transistor having a gate receiving the output node;

a second slave feedback n-channel transistor having a gate receiving an inverse of the slave clock;

wherein the first and second slave feedback p-channel transistors are in series between the power supply and the slave node;

wherein the first and second slave feedback n-channel transistors are in series between the ground and the slave node.

5. The registered buffer chip of claim 4 wherein the slave transmission gate comprises an n-channel transistor having a gate receiving the slave clock and a p-channel transistor receiving the inverse of the slave clock.

6. The registered buffer chip of claim 1 further comprising a plurality of the dual-bit slices, each dual-bit slice in the plurality of dual-bit slices coupled to a different pair of data input signals, and each generating a different pair of first and second data outputs, whereby multiple dual-bit slices are in the registered buffer chip and every other bit is muxed during the muxed mode.

7. The registered buffer chip of claim 6 wherein the first data buffer comprises a differential buffer that receives the first internal data signal and a reference voltage, the first data buffer comparing a voltage of the first internal data signal to the reference voltage to generate the first internal data signal;

wherein the second data buffer comprises a differential buffer that receives the second data signal and a reference voltage, the second data buffer comparing a voltage of the second data signal to the reference voltage to generate the second internal data signal.

8. The registered buffer chip of claim 6 wherein the output node of the first muxed flip-flop is the first data output, or the output node is buffered to generate the first data output;

wherein the output node of the second muxed flip-flop is the second data output, or the output node is buffered to generate the second data output.

9. The registered buffer chip of claim 6 wherein the slave inverting gate is a NOR gate or a NAND gate receiving a reset signal, whereby the slave stage is resetable.

10. The registered buffer chip of claim 6 wherein the master inverting gate is an inverter or a NAND gate or a NOR gate.

11. The registered buffer chip of claim 6 wherein the slave clock is a differential clock generated by the slave clock buffer, having a true slave clock and a complement slave clock driven to the slave stages;

wherein the first clock is a differential clock generated by the first master clock buffer, having a true first clock and a complement first clock driven to the muxed master stages;

wherein the second clock is a differential clock generated by the second master clock buffer, having a true second clock and a complement second clock driven to the muxed master stages, whereby differential clocks are driven to the first and second muxed flip-flops.

12. A data register comprising:

a first input buffer receiving a first data input and generating a first data signal;

a second input buffer receiving a second data input and generating a second data signal;

a slave clock buffer receiving a differential clock, and pulsing a slave clock in both a muxed mode and in a pass-through mode;

a first clock buffer receiving the differential clock, and pulsing a first clock in the pass-through mode but not pulsing the first clock in the muxed mode;

a second clock buffer receiving the differential clock, and pulsing a second clock in the muxed mode but not pulsing the second clock in the pass-through mode;

a first master circuit comprising:

a first transmission gate clocked by the first clock, for sampling the first data signal to a master node;

a second transmission gate clocked by the second clock, for sampling the second data signal to the master node;

an inverter from the master node to a coupled node;

a feedback gate having the coupled node, the first clock, and the second clock as inputs, driving the master node when the first and second transmission gates are closed;

a first slave circuit comprising:

a slave transmission gate clocked by the slave clock, for sampling the coupled node to a slave node;

a slave gate from the slave node to a second slave node;

a slave feedback gate having the coupled node and the slave clock as inputs, driving the slave node when the slave transmission gate is closed;

wherein a first output from the slave is generated from the second slave node or from the slave node; and a second flip-flop having a master that receives the second data signal but not the first data signal, and a slave that generates a second output in response to the slave clock, whereby the first output is muxed from sampling either the first or second data signals, but the second output is generated from the second data signal and not the first data signal.

13. The data register of claim 12 wherein the master feedback gate comprises:

a first feedback p-channel transistor having a gate receiving the coupled node;

a second feedback p-channel transistor having a gate receiving an inverse of the second clock;

a third feedback p-channel transistor having a gate receiving an inverse of the first clock;

a first feedback n-channel transistor having a gate receiving the coupled node;

a second feedback n-channel transistor having a gate receiving the second clock;

a third feedback n-channel transistor having a gate receiving the first clock;

wherein the first, second, and third feedback p-channel transistors are in series between a power supply and the master node;

wherein the first, second, and third feedback n-channel transistors are in series between a ground and the master node.

14. The data register of claim 13 wherein the first transmission gate comprises an n-channel transistor having a gate receiving the inverse of the first clock and a p-channel transistor receiving the first clock;

wherein the second transmission gate comprises an n-channel transistor having a gate receiving the inverse of the second clock and a p-channel transistor receiving the second clock.

15. The data register of claim 14 wherein the slave feedback gate comprises:

a first slave feedback p-channel transistor having a gate receiving the second slave node;

a second slave feedback p-channel transistor having a gate receiving the slave clock;

a first slave feedback n-channel transistor having a gate receiving the second slave node;

a second slave feedback n-channel transistor having a gate receiving an inverse of the slave clock;

wherein the first and second slave feedback p-channel transistors are in series between the power supply and the slave node;

wherein the first and second slave feedback n-channel transistors are in series between the ground and the slave node.

16. The data register of claim 15 wherein the slave transmission gate comprises an n-channel transistor having a gate receiving the slave clock and a p-channel transistor receiving the inverse of the slave clock.

17. The data register of claim 12 further comprising a plurality of dual-bit slices, each dual-bit slice in the plurality of dual-bit slices having a first master circuit and a first slave circuit and a second flip-flop, each of the plurality of dual-bit slices coupled to a different pair of data input signals, and each generating a different pair of first and second data outputs, whereby every other bit is muxed during the muxed mode.

18. The data register of claim 17 wherein the first input buffer comprises a differential buffer that receives the first data signal and a reference voltage, the first input buffer comparing a voltage of the first data signal to the reference voltage to generate the first data signal;

wherein the second input buffer comprises a differential buffer that receives the second data signal and a reference voltage, the second input buffer comparing a voltage of the second data signal to the reference voltage to generate the second data signal.

19. The data register of claim 18 wherein the slave clock is a differential clock generated by the slave clock buffer, having a true slave clock and a complement slave clock driven to the first slave circuit;

wherein the first clock is a differential clock generated by the first clock buffer, having a true first clock and a complement first clock driven to the first master circuit;

wherein the second clock is a differential clock generated by the second clock buffer, having a true second clock and a complement second clock driven to the first master circuit, whereby differential clocks are internally driven.

20. A registered memory module buffer chip comprising:

mode signal means for indicating a muxed mode and a non-muxed mode;

a differential clock input for receiving a differential clock signal;

slave clock buffer means, receiving the differential clock signal, for generating a slave clock that pulses during both the muxed mode and during the non-muxed mode;

first master clock buffer means, receiving the differential clock signal, for generating a first clock that pulses during the non-muxed mode but does not pulse during the muxed mode;

second master clock buffer means, receiving the differential clock signal, for generating a second clock that pulses during the muxed mode but does not pulse during the non-muxed mode;

a dual-bit slice that comprises:

a first data input;

a first data buffer means, receiving the first data input, for driving a first internal data signal;

a second data input;

a second data buffer means, receiving the second data input, for driving a second internal data signal;

first muxed flip-flop means, receiving the first internal data signal as a first mux input and the second internal data signal as a second mux input, for generating a first data output;

second muxed flip-flop means, receiving the second internal data signal as both the first mux input and as the second mux input, for generating a second data output;

wherein the first muxed flip-flop means and the second muxed flip-flop means each comprise a master stage and a slave stage;

wherein the master stage comprises:

first transmission gate means for conducting between the first mux input and the master node in response to the first clock;

second transmission gate means for conducting between the second mux input and the master node in response to the second clock;

master inverting gate means, having the master node as an input, for driving a coupled node;

master feedback gate means, receiving the first clock and the second clock, and having the coupled node as an input, for driving the master node when neither the first transmission gate means nor the second transmission gate means are conducting;

wherein the slave stage comprises:

slave transmission gate means for conducting between the coupled node and a slave node in response to the slave clock;

slave inverting gate means, having the slave node as an input, for driving an output node; and slave feedback gate means, receiving the slave clock, and having the output node as an input, for driving the slave node when the slave transmission gate means is not conducting, whereby the master stage has muxed inputs clocked by mode-enabled clocks so that the first data output but not the second data output is muxed during the muxed mode.

* * * * *